United States Patent
Matsui (10) Patent No.: US 7,112,819 B2
(45) Date of Patent: Sep. 26, 2006

(54) SEMICONDUCTOR DEVICE AND MANUFACTURING METHOD THEREOF

(75) Inventor: Yuichi Matsui, Koganei (JP)

(73) Assignee: Hitachi, Ltd., Tokyo (JP)

( * ) Notice: Subject to any disclaimer, the term of this patent is extended or adjusted under 35 U.S.C. 154(b) by 44 days.

(21) Appl. No.: 10/829,300

(22) Filed: Apr. 22, 2004

(65) Prior Publication Data

US 2005/0001212 A1    Jan. 6, 2005

(30) Foreign Application Priority Data

Apr. 23, 2003    (JP) .............................. 2003-118561

(51) Int. Cl.
*H01L 29/786* (2006.01)
(52) U.S. Cl. .......................... 257/71; 257/52; 257/306; 257/310
(58) Field of Classification Search .................. 257/71
See application file for complete search history.

(56) References Cited

U.S. PATENT DOCUMENTS

| | | | |
|---|---|---|---|
| 5,622,888 A | 4/1997 | Sekine et al. ................ 438/398 |
| 5,970,337 A | 10/1999 | Nishioka ..................... 438/240 |
| 6,235,572 B1 | 5/2001 | Kunitomo et al. .......... 438/240 |
| 6,243,255 B1 | 6/2001 | Kuge et al. .................. 361/528 |
| 6,576,928 B1 | 6/2003 | Hiratani et al. ................ 257/68 |
| 6,673,461 B1 | 1/2004 | Chazono et al. ............. 428/469 |
| 2002/0074582 A1* | 6/2002 | Hiratani et al. .............. 257/296 |
| 2003/0011022 A1 | 1/2003 | Manabe ....................... 257/314 |
| 2003/0102501 A1* | 6/2003 | Yang et al. .................. 257/295 |
| 2003/0151083 A1 | 8/2003 | Matsui et al. ................ 257/310 |
| 2004/0111849 A1* | 6/2004 | Omori et al. ............... 29/25.03 |

FOREIGN PATENT DOCUMENTS

| | | |
|---|---|---|
| JP | 5-345663 | 12/1993 |
| JP | 8-31951 | 2/1996 |
| JP | 8-139288 | 5/1996 |
| JP | 409017949 A * | 1/1997 |
| JP | 10-12043 | 1/1998 |
| JP | 11-330415 | 11/1999 |
| JP | 2000-12796 | 1/2000 |
| JP | 2000-82639 | 3/2000 |
| JP | 2001-77108 | 3/2001 |
| JP | 2001-284158 | 10/2001 |
| JP | 02002016234 A * | 1/2002 |
| JP | 2002-164516 | 6/2002 |
| JP | 2003-243534 | 8/2003 |

OTHER PUBLICATIONS

Rosenfeld, D. et al., "Structural and morphological characterization of $Nb_2O_5$ thin films deposited by reactive sputtering", *American Vacuum Society*, 1994, pp. 135-139.

* cited by examiner

*Primary Examiner*—Tu-Tu Ho
(74) *Attorney, Agent, or Firm*—Miles & Stockbridge, P.C.

(57) ABSTRACT

A capacitor uses niobium pentoxide in the manufacture of a semiconductor device. The niobium pentoxide has a low crystallization temperature of 600° C. that provides control over the oxidation of the bottom electrode during heat-treatment. A dielectric constituent present as an amorphous oxide along the grain boundaries of polycrystalline niobium pentoxide is used for a capacitor insulator, thereby providing a method to decrease the leakage current along the grain boundary of niobium pentoxide and to realize a high dielectric constant and low-temperature crystallization.

17 Claims, 5 Drawing Sheets

CRYSTAL GRAIN OF NIOBIUM PENTOXIDE   AMORPHOUS OXIDE

FIG.3B

AMORPHOUS OXIDE   CRYSTAL GRAIN OF NIOBIUM PENTOXIDE

BOTTOM ELECTRODE

- TOP ELECTRODE 8
- DIELECTRICS 7
- BOTTOM ELECTRODE 6
- SILICON OXIDE 5
- SILICON NITRIDE 4
- PLUG 1
- INSULATING INTERLAYER 2

FIG.7

SEMICONDUCTOR DEVICE AND MANUFACTURING METHOD THEREOF

CROSS-REFERENCE TO RELATED APPLICATION

The present application claims priority from Japanese application JP 2003-118561 filed on Apr. 23, 2003, the content of which is hereby incorporated by reference into this application.

FIELD OF INVENTION

The invention relates to the field of semiconductor devices and manufacturing methods thereof, and more particularly to an improved semiconductor device comprising a capacitor, for instance DRAM (Dynamic Random Access Memory), and a manufacturing method thereof.

BACKGROUND OF INVENTION

It is known that a tantalum pentoxide film with a dielectric constant of several tens has been adopted to achieve a high degree of integration of a semiconductor device, in lieu of a silicon oxide film (dielectric constant: about 4) and a silicon nitride film (dielectric constant: about 7) which have been used for a capacitor dielectric (for example, refer to patent document 1).

There is a method to produce a capacitor comprising a tantalum pentoxide film, wherein the tantalum pentoxide film is formed on the capacitor's bottom electrode, the film crystallized by heat-treatment, and then the capacitor's top electrode formed thereon. The reason for heat-treating the tantalum pentoxide film is to obtain a capacitor with higher electric capacitance using a characteristic of the tantalum pentoxide film in which crystallization provides a higher dielectric constant. However, in this manufacturing process, it is known that a heat-treatment at a temperature higher than 750° C. is necessary to fully crystallize the tantalum pentoxide film (for example, refer to patent document 2).

Hereinafter, the heat-treatment temperature used for crystallizing the dielectric is called a crystallization heat-treatment temperature.

REFERENCES

[Patent document 1] JP-A No. 139288/1996
[Patent document 2] JP-A No. 12796/2000
[Patent document 3] JP-A No. 82639/2000
[Patent document 4] JP-A No. 164516/2002
[Patent document 5] JP-A No. 77108/2001
[Patent document 6] JP-A No. 345663/1993
[Patent document 7] JP-A No. 12043/1998
[Patent document 8] JP-A No. 284158/2001
[Patent document 9] JP-A No. 31951/1996
[Patent document 10] JP-A No. 330415/1999
[Non-patent document 1] Journal of Vacuum Science and Technology A, Vol. 12 (1994), p. 135

Before describing the problems caused by heat-treatment above 750° C., which is a relatively high temperature for crystallization, capacitor structures will be described.

Capacitors comprising dielectrics of tantalum pentoxide films are broadly grouped under MIS (Metal-Insulator-Semiconductor) structures, wherein a polycrystalline silicon film is used as the bottom electrode, and MIM (Metal-Insulator-Metal) structures, in which a metal film is used as the bottom electrode. In addition to the difference in the bottom electrode material, the difference between MIS structures and MIM structures is that the MIM structure needs a barrier metal. The barrier metal is formed between the bottom electrode and plugs connected with the bottom electrode and is necessary to prevent a reaction between the bottom electrode and the plugs. When the plugs react with the bottom electrode, electrical conduction is adversely affected. Titanium nitride formed between the plug consisting of polycrystalline silicon and the bottom electrode consisting of ruthenium is an example of a barrier metal.

Hereinafter, in the process of forming a tantalum pentoxide film, problems caused by heat-treatment above 750° C., which is a relatively high temperature for crystallization, are explained. In MIS structures, the silicon of the bottom electrode is oxidized by this heat-treatment, decreasing capacitance. The reason is that, during the crystallization heat-treatment of the tantalum pentoxide film, silicon reduces the tantalum pentoxide film because the silicon is oxidized thermodynamically easier than tantalum, resulting in formation of a silicon oxide film with a small dielectric constant. The problem of decreasing capacitor capacitance also occurs in case a silicon nitride film is formed at the bottom electrode interface to prevent the silicon from oxidation. The silicon nitride film is oxidized because of the same reason, resulting in decreased capacitance of the capacitor. Moreover, in the case of MIM structures, the barrier metal is oxidized by oxygen atoms diffused in the electrode and the electrical conductivity is impaired, even if there is no problem of oxidation in the metallic electrode itself. The reason is described as follows. For instance, when ruthenium is used for the bottom electrode, good oxygen permeability of the ruthenium film allows the oxygen atoms to dissolve in the bottom electrode during the formation process of the tantalum pentoxide film. The barrier metal is oxidized by the dissolved oxygen atoms during subsequent crystallization heat-treatment of the dielectric.

Each of these problems of MIS structures or MIM structures does not depend on the atmosphere of the crystallization heat-treatment. In the case wherein the heat-treatment is carried out in an oxygen atmosphere to manufacture capacitors using a tantalum pentoxide film, it may be possible to prevent the bottom electrode and barrier metal from oxidation by lowering the heat-treatment temperature for oxidation, but it would not be a fundamental solution of the problem without lowering the crystallization temperature.

When a tantalum pentoxide film is used as a capacitor dielectric film, it is extremely difficult to decrease the crystallization temperature to below 750° C.

As an approach to solving the problems caused by the relatively high heat-treatment temperature for crystallization of the tantalum pentoxide film, an attempt was made to use a niobium pentoxide film as the capacitor dielectric film. The reason is that it is known that a niobium pentoxide film is crystallized below 600° C. which is more than 100° C. lower than the crystallization temperature of a tantalum pentoxide film.

The crystallization temperature of a niobium pentoxide film is shown in, for instance, the non-patent document 1. Moreover, the application of niobium pentoxide as a next generation condenser material is being studied, which is described in, for instance, the patent document 3.

An experimental procedure will be described as follows. A tantalum pentoxide film and niobium pentoxide film were formed on a platinum bottom electrode by an RF sputtering method using oxide targets. The conditions for formation were a $N_2/O_2$ gas mixture of 10 mTorr (pressure ratio $N_2/O_2=1/1$), a substrate temperature of 300° C., and a film thickness of 20 nm. After preparing a dielectric, it was heat-treated in the range of 500° C.–800° C. in a nitrogen atmosphere and then heat-treated at 500° C. for two minutes in an oxygen atmosphere.

Figure 1A:
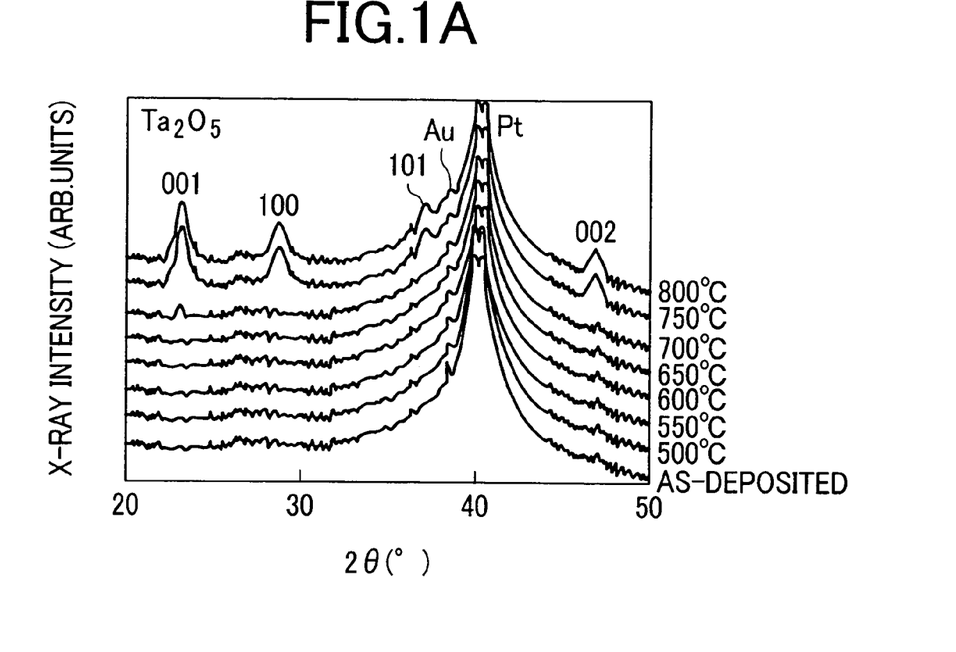
FIGS. 1A to 1B are x-ray diffraction patterns illustrating that a niobium pentoxide film has a crystallization temperature less than that of tantalum pentoxide. The number indexed on the peaks in the figures shows the lattice planes.
Figure 1B:
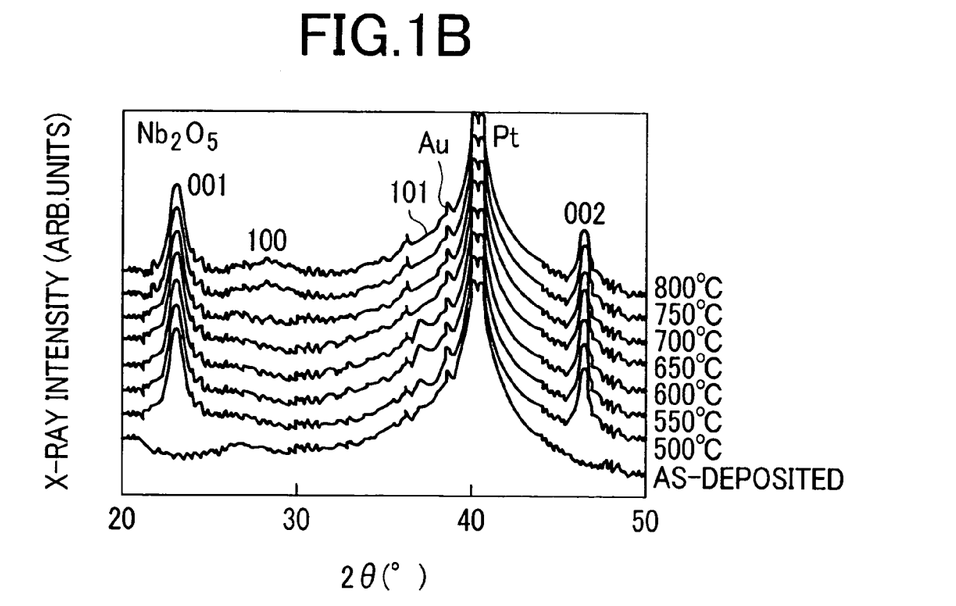

FIG. 1 shows the temperature dependence of the x-ray diffraction pattern. The peak shown at around 2θ of 40° is the 111 diffraction peak of the platinum bottom electrode. Additionally, the small peak shown at around 2θ of 38° with a small half-width is the 111 diffraction peak of the gold formed as a top electrode. When tantalum pentoxide is heated above 750° C. (FIG. 1A), peaks arising from the 001 and 101 diffraction peaks of a crystallized tantalum pentoxide can be observed around 22–23° and 36–370, respectively. Therefore, this shows that, in this experimental condition, the crystallization temperature of a tantalum pentoxide film is 750° C. On the other hand, from FIG. 1B, one can conclude that the crystallization temperature of a niobium pentoxide film is below 500° C., which is more than 200° C. lower than that of a tantalum pentoxide film.

Figure 2:
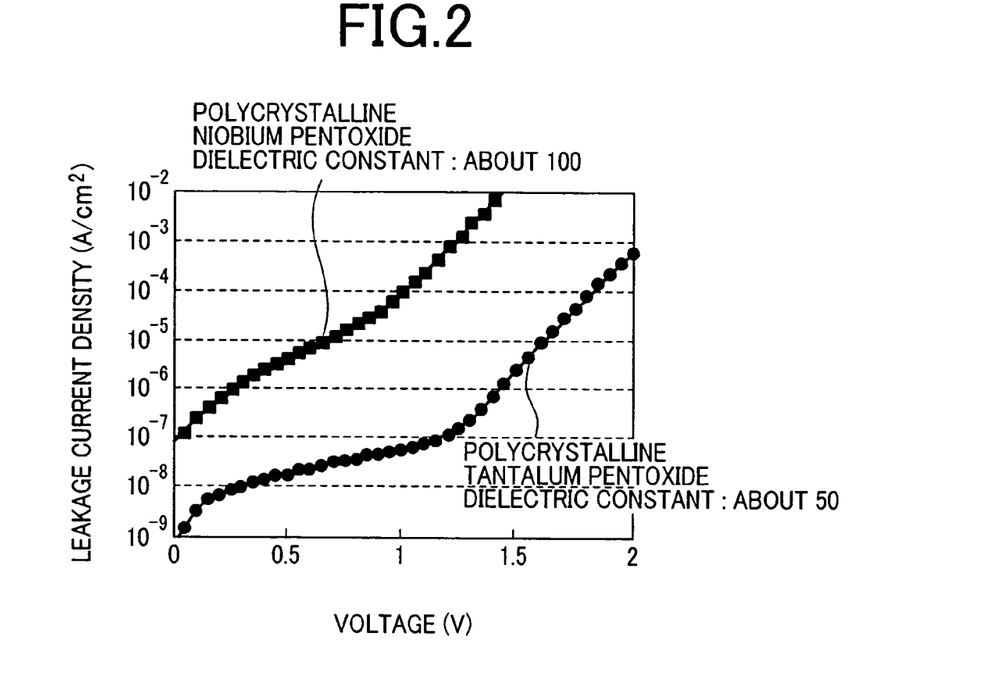
FIG. 2 illustrates that a polycrystalline niobium pentoxide film has greater leakage current density than polycrystalline tantalum pentoxide.

FIG. 2 shows a comparison of electrical properties of these dielectrics. The heat-treatment temperature was controlled to be 750° C. The horizontal axis shows voltage, and the vertical axis leakage current density. It is clear that the leakage current density of the niobium pentoxide film is extremely large compared with the tantalum pentoxide film. However, the dielectric constant of the niobium pentoxide is about 100, which is two times greater than the dielectric constant of about 50 of the tantalum pentoxide film.

Here, the reason why the leakage current of a niobium pentoxide film is large will be described. In an amorphous material, niobium pentoxide has a low leakage current like tantalum pentoxide, but crystallization drastically increases the leakage current. These results indicate that the leakage current of a niobium pentoxide film is caused by grain boundaries. In particular, the leakage current caused by grain boundaries raises serious problems in a capacitor for a semiconductor device because a very thin dielectric with a thickness less than 20 nm is used.

To summarize, it was found that applying a niobium pentoxide film with a lower crystallization temperature to the dielectric is useful to avoid the relatively high heat-treatment temperature when using a tantalum pentoxide film, but there is a problem that a niobium pentoxide film has a larger leakage current density caused by grain boundaries.

Typical methods and devices that solve the above-mentioned problems will now be explained.

SUMMARY OF THE INVENTION

This invention uses a dielectric, in which an amorphous oxide is present at crystal grain boundaries of a polycrystalline oxide such as niobium pentoxide.

The invention provides a solution that overcomes the large leakage current density of a niobium pentoxide film, for example, because it is possible to reduce the leakage current flowing along grain boundaries of niobium pentoxide.

As a result, one can realize a capacitor, wherein the crystallization temperature is low, the dielectric constant large, and the leakage current small.

An amorphous oxide when used with niobium pentoxide in the invention is a material different from niobium pentoxide. As described later, it is an oxide which has a higher crystallization temperature than niobium pentoxide, for example tantalum oxide, silicon oxide, titanium oxide, and tungsten oxide.

The oxide present at the crystal grain boundaries should be amorphous, because, if the oxide is crystallized, it cannot completely bridge the grain boundaries of the niobium pentoxide and prevent the leakage current caused by the grain boundaries.

Amorphous oxide bridges the crystal grains of niobium pentoxide in the dielectric. If there are some crystal grains which contact the top electrode and bottom electrode, for example, an amorphous oxide is not necessary to be present at the boundaries of electrodes and crystal grains. Moreover, when the crystal grains of niobium pentoxide are larger than the film thickness of the dielectric, it is expected that there are some crystal grains contacting both top and bottom electrodes. The amorphous oxide should be present between crystal grain boundaries, but it is not necessary for the amorphous oxide to be present between the electrodes and crystal grains.

The ratio of polycrystalline niobium pentoxide and the amorphous oxide will be explained. In order to capitalize on the high dielectric constant of niobium pentoxide, the proportion of amorphous oxide should be low.

Conversely, the leakage current can be better controlled when the proportion of amorphous oxide increases. The ratio of polycrystalline niobium pentoxide and amorphous material can be decided by the specifications such as the capacitance and the leakage current density demanded of the capacitor, but the proportion of amorphous oxide is preferably from 5% to 50% of the dielectric material. It is believed that amorphous oxide cannot completely bridge the grain boundaries of the polycrystalline oxide when the amount of amorphous oxide is less than 5%, resulting in increased leakage current passing through the grain boundaries of polycrystalline oxide beyond the acceptable range of the leakage current of the whole capacitor. Since the dielectric constant of tantalum pentoxide film is as small as about 20 in an amorphous state, an amorphous oxide amount that does not exceed 50% is preferred, since the average dielectric constant of the capacitor, with polycrystalline niobium pentoxide is almost the same average dielectric constant as that of polycrystalline tantalum pentoxide film. Using a tantalum pentoxide as an amorphous oxide in an amount greater than 50%, it is thought that the effects of using niobium pentoxide as the polycrystalline oxide, which has a high dielectric constant, may be undermined.

A solid solution of tantalum pentoxide and niobium pentoxide is described in, for instance, the patent document 4. Furthermore, composite oxides such as tantalum-tungsten and tantalum-molybdenum are described in the patent document 5. However, a significant difference of each well-known example from this invention is that the objects thereof are crystallization of the whole film, not bridging grain boundaries Methods to form an insulator along grain boundaries are described in, for instance, patent documents 6, 7, 8, 9, and 10. However, each well-known example is about ceramic condensers and the materials and manufacturing methods used are different from those of the present invention.

The following is a description of a manufacturing method of semiconductor devices of this invention.

Hereinafter, a method using tantalum pentoxide as an amorphous oxide is described. However, as described later, this example is not to be construed to limit the scope of the invention.

First, a dielectric comprising a composite film of niobium pentoxide and tantalum pentoxide is deposited on a bottom electrode using a CVD method that uses a niobium organic compound and a tantalum organic compound as the raw materials.

Second, the article is heat treated at a temperature greater than the crystallization temperature of the niobium pentoxide and less than the crystallization temperature of the tantalum pentoxide. Niobium pentoxide crystallizes, and tantalum pentoxide remains amorphous, segregating around crystal grains of the niobium pentoxide. As a result, a dielectric is formed, wherein an amorphous tantalum pentoxide is present along the boundaries of the polycrystalline niobium pentoxide.

The above-described amorphous oxide comprises a material different from niobium pentoxide. The material is one which has a higher crystallization temperature than niobium pentoxide, and examples of suitable oxides include silicon oxide, titanium oxide, and tungsten oxide besides tantalum oxide.

A raw material of niobium pentoxide may be one which includes niobium, and examples include pentaethoxy niobium $[Nb(C_2H_5O)_5]$. Moreover, a raw material of tantalum pentoxide may be one which includes tantalum, and examples include pentaethoxy tantalum $[Ta(C_2H_5O)_5]$. Both raw materials may be supplied by two separate routes or a by composite material with an arbitrary composition. Raw materials of silicon oxide, titanium oxide, and tungsten oxide may also be one which includes silicon, titanium, and tungsten. These raw materials may be supplied by two separate routes with a raw material of niobium or a composite material with an arbitrary composition.

The ratio of raw materials of niobium and other oxides will be described. In the case where the proportion of niobium raw material is controlled to be higher, the proportion of the polycrystalline niobium pentoxide becomes higher in the dielectric formed. On the other hand, when the proportion of niobium raw material is lower, the proportion of the amorphous oxide becomes greater. Because the proportion of the amorphous oxide is preferably from 5% to 50%, the proportion of the source raw materials is also preferably from 5% to 50%.

The appropriate temperature of heat-treatment is preferably higher than the crystallization temperature of niobium pentoxide and less than the crystallization temperature of the other oxide. Examples include temperatures from 400° C. to 700° C. Because the niobium pentoxide does not crystallize at a temperature lower than 400° C., and crystallization of not only niobium pentoxide but also of tantalum pentoxide occurs at a temperature higher than 700° C., with a dielectric comprising niobium pentoxide and tantalum pentoxide the effects of this invention cannot be obtained at a temperature lower than 400° C. or higher than 700° C.

Ruthenium, platinum, copper, titanium nitride, tantalum nitride, and tungsten nitride may be used for the bottom electrode in a capacitor comprising a MIM structure. In the case of a MIS structured capacitor, polycrystalline silicon may be used. In the case of using polycrystalline silicon, the surface of polycrystalline silicon is oxidized during the formation and heat-treatment processes of the dielectric, resulting in formation of a silicon oxide film between the dielectric and the bottom electrode.

The thickness of the dielectric may be decided by the capacitor specifications. However, preferably, it is from nm to 20 nm, because a thinner film thickness provides a greater leakage current density and a thicker film thickness provides a smaller electric capacitance.

In order to verify the effects of this invention, films of polycrystalline tantalum pentoxide, polycrystalline niobium oxide, and a composite of polycrystalline niobium and amorphous tantalum pentoxide were prepared, and their properties were compared.

The tantalum pentoxide film was prepared by a CVD method using a raw material of pentaethoxy tantalum and heat-treated at 750° C. The niobium pentoxide film was prepared by a CVD method using a raw material of pentaethoxy niobium and heat-treated at 600° C. The composite film of niobium pentoxide and tantalum pentoxide was prepared by a CVD method using as a raw material a mixture of pentaethoxy tantalum and pentaethoxy niobium, and it was heat treated at 600° C. Ruthenium was used as a bottom electrode. The thickness of the dielectric was controlled to be 10 nm.

Figure 3A:
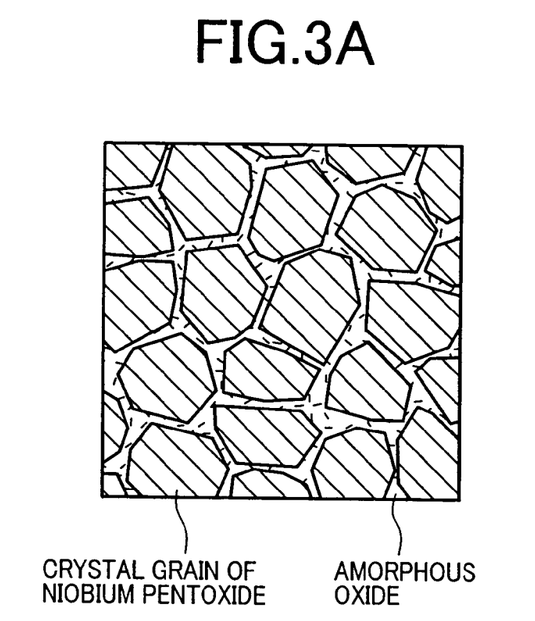
Figure 3B:
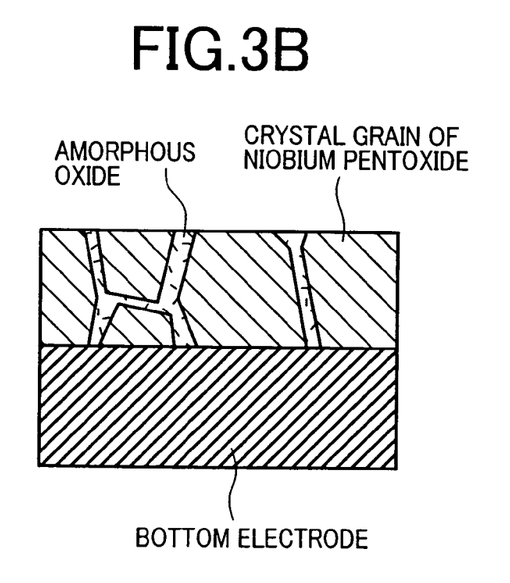

FIG. 3 illustrates the electron microscope observations of the composite film of niobium pentoxide and tantalum pentoxide. FIG. 3A is an image of the surface and FIG. 3B a cross-sectional image. These illustrations show that the film is separated into crystallized areas and amorphous areas. According to the elemental analysis, it was found that the crystallized parts were niobium oxide film and the amorphous parts were tantalum oxide. In other words, it is a structure, wherein amorphous tantalum pentoxide bridges the boundaries of niobium pentoxide crystals, namely the grain boundaries. It is postulated that the niobium pentoxide is crystallized by heat treatment at a temperature greater than the crystallization temperature of niobium pentoxide and less than that of tantalum pentoxide, and the tantalum pentoxide remains an amorphous material segregating crystal grains of niobium pentoxide.

Figure 4:
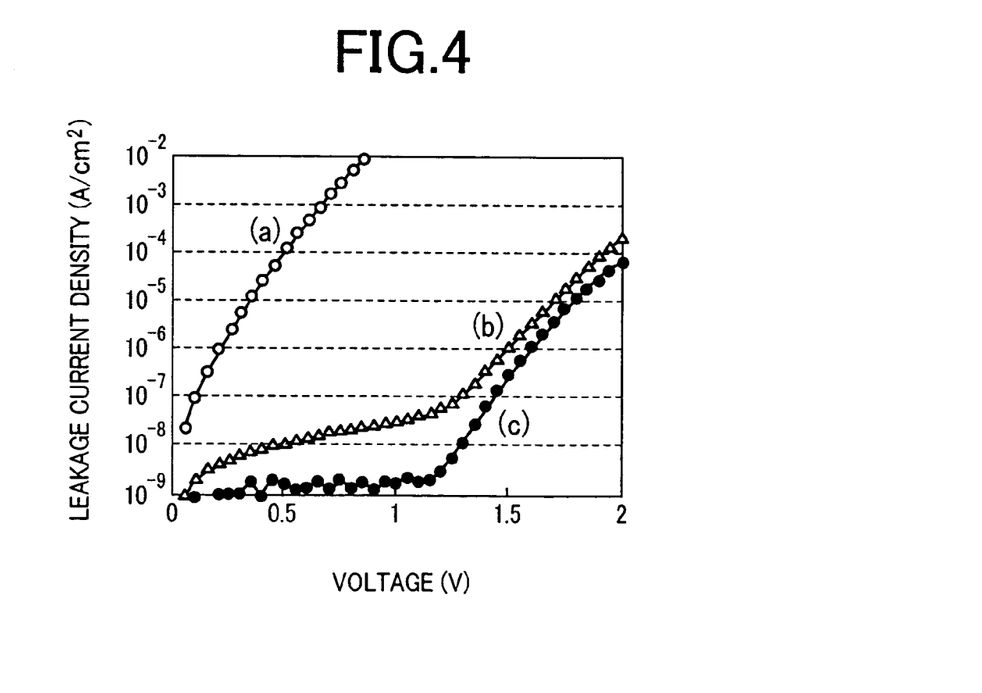
FIG. 4 illustrates the leakage current density for different films. The line (a) shows a leakage current density of polycrystalline niobium pentoxide, line (b) shows that of a polycrystalline tantalum pentoxide, and line (c) shows that of a composite film of polycrystalline niobium pentoxide and amorphous tantalum pentoxide.

FIG. 4 shows a comparison of the leakage current densities. The horizontal axis shows the voltage, and the vertical axis shows the leakage current density. (a) is the leakage current density of the polycrystalline niobium pentoxide film, (b) is that of the polycrystalline tantalum pentoxide film, and (c) is that of the composite film of polycrystalline niobium pentoxide and amorphous tantalum pentoxide. The leakage current of the polycrystalline niobium pentoxide film is very much greater than that of polycrystalline tantalum pentoxide film. The composite film of polycrystalline niobium pentoxide and amorphous tantalum pentoxide of this invention has a lower leakage current density compared with the polycrystalline tantalum pentoxide film. Moreover, the dielectric constant of the composite film of polycrystalline niobium pentoxide and amorphous tantalum pentoxide in the present invention is about 95, which is almost the same as the 100 of niobium pentoxide, whereas the dielectric constant of the polycrystalline tantalum pentoxide is about 50.

Clearly, using a composite film of polycrystalline niobium pentoxide and amorphous tantalum pentoxide reduces the leakage current flowing along the grain boundaries of niobium pentoxide, resulting in a high dielectric constant and a capacitor which has a smaller leakage current density than that of a tantalum pentoxide film, while using a low crystallization temperature.

An example of a composite film of polycrystalline niobium pentoxide and amorphous tantalum pentoxide has been shown, but the present invention is not intended to be limited to these specific embodiments. It is possible to realize a capacitor having above-described characteristics wherein an oxide having a greater crystallization temperature than niobium pentoxide is used as an amorphous oxide to be mixed with niobium pentoxide and heat-treated at a temperature greater than the crystallization temperature of niobium pentoxide and less than that of the mixed oxide.

BRIEF DESCRIPTION OF THE DRAWINGS

FIGS. 3A and 3B are schematic microstructural views of a composite film of polycrystalline niobium pentoxide and amorphous tantalum pentoxide. FIG. 3A shows the surface structure and FIG. 3B shows a cross-sectional view.

DETAILED DESCRIPTION OF THE PREFERRED EMBODIMENTS

Embodiment 1

Figure 5:
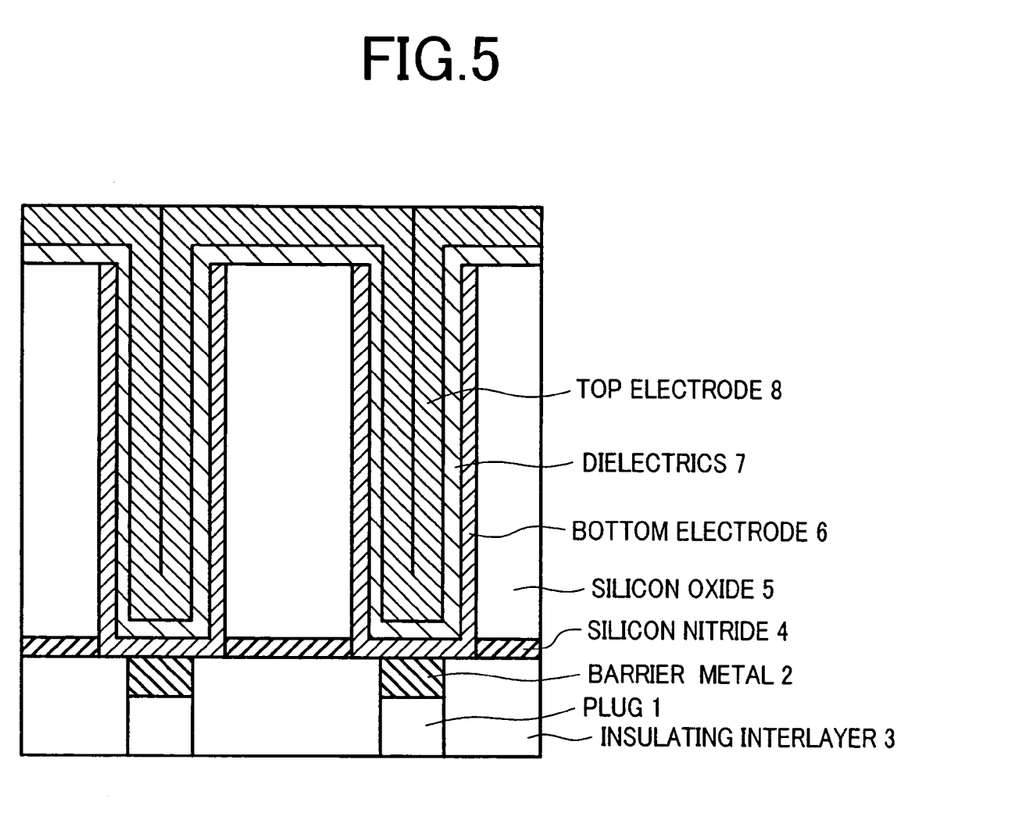
FIG. 5 is a schematic longitudinal cross section to describe a first embodiment.

The embodiment 1 of the present invention will be described with reference to FIG. 5. The illustration is one, wherein this invention is applied to a semiconductor device, particularly to a DRAM, which has a MIM capacitor with a dielectric comprising a composite film of a polycrystalline niobium pentoxide and an amorphous tantalum pentoxide.

The following illustrates a method of manufacturing such a capacitor.

First of all, a silicon nitride film 4 and silicon oxide film 5 are formed on a substrate comprising plug 1 of polycrystalline silicon, barrier metal 2 of titanium nitride, and insulating interlayer 3 of a silicon oxide film. Subsequently, channels are formed in the silicon nitride film 4 and silicon oxide film 5 until the barrier metal 2 is exposed. The channels may be processed by a dry-etching method using a mask of photo-resist film or tungsten film.

Next is a process, wherein the bottom electrode 6 of ruthenium is deposited. After forming a seed layer of a ruthenium film by a sputtering method, a ruthenium film with a film thickness of 20 nm is deposited using a CVD method. The formation of a ruthenium film by a CVD method is carried out by transporting a solution in which an organometallic complex, $Ru(C_2H_4C_2H_5)_2$ bis (ethylcyclopentadienyl) ruthenium, is dissolved in $(C_2H_4)_2O$ (tetrahydrofuran) with a concentration of 0.1 mol/l. A liquid raw material is mixed with oxygen gas and nitrogen gas in a shower head facing the substrate, and is sprayed on the substrate. The substrate temperature is controlled to be 290° C. and the pressure is 5 Torr.

In this process, the ruthenium film is preferably sintered to prevent the film from changing shape during the subsequent heat-treatment.

More particularly, the heat-treatment may be carried out in an inert atmosphere or a reducing atmosphere, for instance argon, at 600° C. and for 1 min.

Next is a process, wherein an insulator is deposited on the whole surface of the substrate (not illustrated). Preferably, the insulator should be an SOG film on account of the conformality and the etching selectivity with the silicon oxide film 5. In this process, the ruthenium film deposited on the silicon oxide film is removed. An etchback method or CMP method can be applied to remove this film. A remaining insulator inside the channel (not shown in the figure) may be removed by wet-etching. In this manner the bottom electrode 6 of ruthenium is formed.

Next is a process, wherein the dielectric 7 comprising a composite film of niobium pentoxide and tantalum pentoxide is deposited using a CVD method. A mixture of pentaethoxy tantalum [$Ta(C_2H_5O)_5$] and pentaethoxy niobium [$Nb(C_2H_5O)_5$] is used as a precursor material.

The mixture ratio is 10% pentaethoxy tantalum and 90% pentaethoxy niobium. The process conditions are a $N_2/O_2$ mixed gas of 0.5 Torr (pressure ratio: $N_2/O_2=2/1$), 430° C. substrate temperature, and 10 nm film thickness.

Then, the dielectric 7 is heat-treated in a nitrogen atmosphere at 600° C. for 2 min and in an oxygen atmosphere at 500° C. for 1 min.

Niobium pentoxide segregates and crystallizes, and the tantalum pentoxide remains amorphous around the crystal grains of tantalum pentoxide. As a result, a dielectric is formed, wherein amorphous tantalum pentoxide is present along the grain boundaries of the polycrystalline niobium pentoxide.

Next is a process, wherein the top electrode 8 of titanium nitride is deposited on the dielectric 7 using a CVD method.

Then, a photo-resist film is formed on the top electrode as a mask, and with this photo-resist film as a mask, applying a dry-etching technique to the top electrode 8 and dielectric 7 one forms a preferred shape.

In the foregoing method, one manufactures a MIM structured capacitor comprising the bottom electrode 6 of ruthenium, dielectric 7 comprising the composite film of polycrystalline niobium pentoxide and amorphous tantalum pentoxide, and the top electrode 8 of titanium nitride. A DRAM memory cell can be formed using this capacitor and a MISFET for selecting a memory cell connected in series with the capacitor.

The embodiment 1 provides a method of lowering the crystallization temperature of a capacitor dielectric, thereby preventing the barrier metal from oxidation, which may be a problem in a MIM structured capacitor. As a result, the characteristics of the capacitor become uniformly better, and the performance of the DRAM and reliability can be improved.

The above-mentioned example of a method of manufacturing a semiconductor device uses titanium nitride as a barrier metal and a top electrode. However, there is a wide choice of materials and similar effects may be obtained, for example, using a material selected from tantalum nitride, aluminum-doped titanium nitride, and silicon-doped tantalum nitride as a barrier metal, in lieu of titanium nitride. Moreover, the same effect can be achieved when ruthenium, platinum, copper, tantalum nitride, or tungsten nitride, for example, are used for the top electrode.

The heat-treatment temperature of the dielectric is not limited to 600° C. It may be higher than the crystallization temperature of niobium pentoxide and less than the crystallization temperature of tantalum pentoxide. This means that a similar effect can be achieved when the heat treatment is carried out in the temperature range from 400° C. to 700° C.

The proportion of pentaethoxy niobium, which is mixed with pentaethoxy tantalum, is not limited to 10%. It is preferably from 5% to 50%. This range of pentaethoxy niobium provides an amorphous tantalum pentoxide content of 5% to 50%, which is compatible with low leakage current and a high dielectric constant.

Moreover, the capacitor described in embodiment 1 can be applied not only to a DRAM, but also to semiconductor devices including a DRAM and other semiconductor devices which have a capacitor.

Embodiment 2

Figure 6:
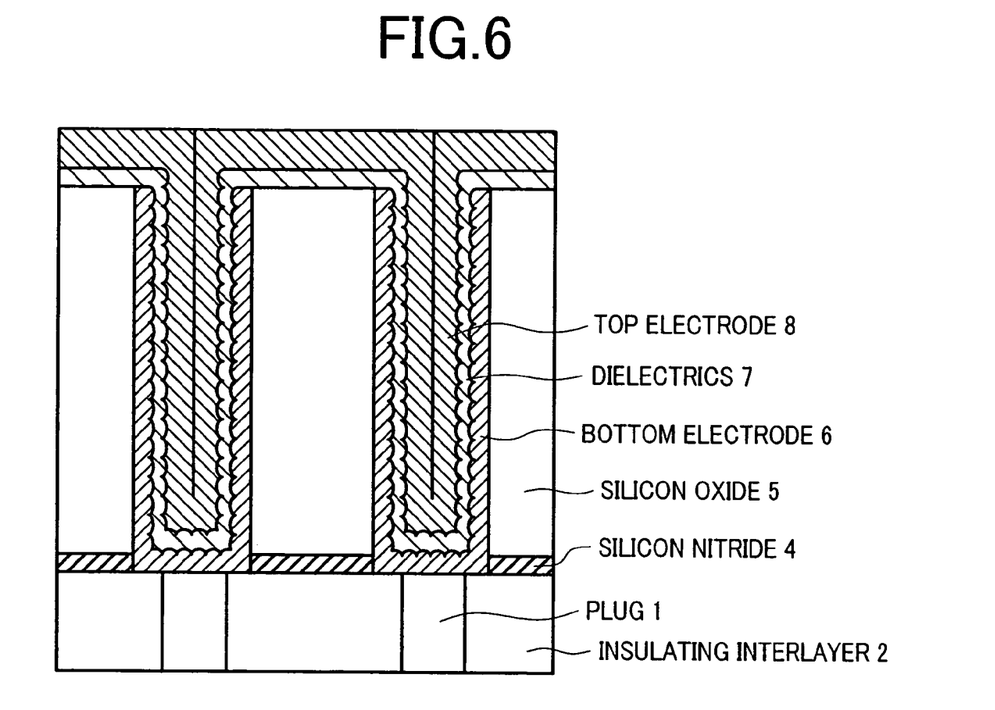
FIG. 6 is a schematic longitudinal cross section to describe a second embodiment.

The embodiment 2 of the present invention will be described with reference to FIG. 6. The illustration is one, wherein this invention is applied to a semiconductor device, particularly to a DRAM, which has a MIS capacitor using a dielectric comprising a composite film of a polycrystalline niobium pentoxide and an amorphous tantalum pentoxide.

The following illustrates a method of manufacturing such a capacitor.

First, a silicon nitride film 4 and a silicon oxide film 5 are formed on a substrate comprising plug 1 of polycrystalline silicon and insulating interlayer 3 of a silicon oxide film.

Subsequently, channels are formed in the silicon nitride film 4 and silicon oxide film 5 until the barrier metal 2 is exposed, as described in the embodiment 1.

Next is a process, wherein a 20 nm thick conductive amorphous silicon film is formed along the inner surface of the channel and the surface of the silicon oxide film 5, and the amorphous silicon film deposited on top of the silicon oxide film using a photolithography method and a dry-etching method, leaving the amorphous silicon film only on the inner surface of a deep hole. After forming a seed of silicon along the inner surface of the channel, it is heat-treated at 630° C. to crystallize and to form a rough surface, producing a bottom electrode 6 of polycrystalline silicon.

Next is a process, wherein the silicon nitride film is formed by doping P into the surface of the bottom electrode 6 of polycrystalline silicon using $PH_3$ and a following heat-treatment in an ammonia atmosphere. Because the film thickness is an extremely small 2 nm, it is not illustrated in FIG. 6. This silicon nitride film is effective in preventing the polycrystalline silicon film of the bottom electrode from oxidation during the dielectric formation process and the heat-treatment.

In the next step, a composite film of niobium pentoxide and tantalum pentoxide is deposited. The deposition of the composite film is carried out in the same way as embodiment 1. Additionally, it is heat-treated under the same condition as described in embodiment 1, forming the dielectric 7, wherein amorphous tantalum pentoxide is present along the grain boundaries of the polycrystalline niobium pentoxide. Then, just as in embodiment 1, the top electrode is deposited and formed in a preferred shape.

In the foregoing method, one manufactures a MIM structured capacitor comprising the bottom electrode 6 of polycrystalline silicon film, dielectric 7 comprising the composite film of polycrystalline niobium pentoxide and amorphous tantalum pentoxide, and the top electrode 8 of titanium nitride. A DRAM memory cell can be formed using this capacitor and a MISFET for selecting a memory cell connected in series with the capacitor.

The embodiment 2 provides a way to lower the crystallization temperature of a capacitor dielectric, thereby preventing decreased capacitance caused by oxidation of the bottom electrode, which may be a problem in a MIS structured capacitor. As a result, the characteristics of the capacitor become uniformly better, and the performance of the DRAM and reliability can be improved.

The above-mentioned example of a method of manufacturing a semiconductor device uses titanium nitride as a bottom electrode. However, there is a wide choice of materials and similar effects may be obtained when using a material selected, for example, from ruthenium, platinum, copper, tantalum nitride, and tungsten nitride, in lieu of titanium nitride.

Moreover, the capacitor described in embodiment 2 can be applied not only to a DRAM, but also to semiconductor devices including a DRAM and other semiconductor devices which have a capacitor.

Embodiment 3

Figure 7:
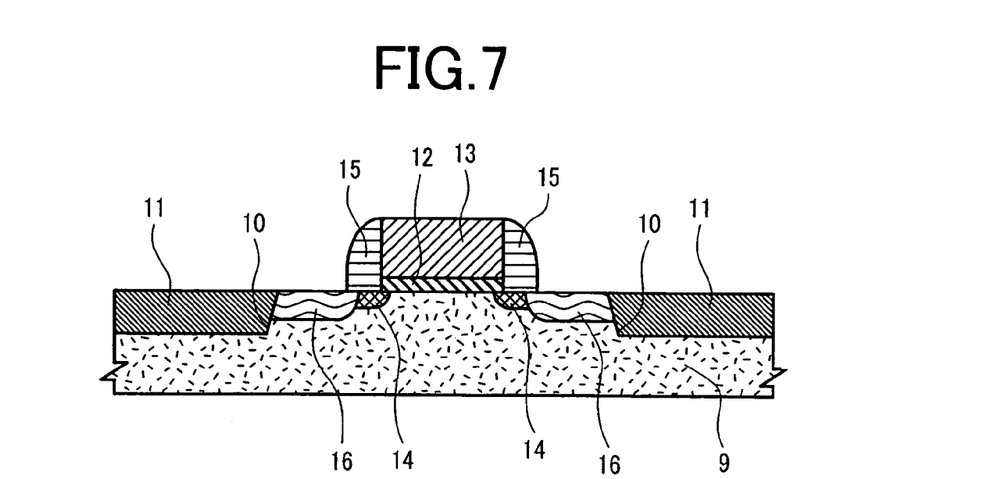
FIG. 7 is a schematic longitudinal cross section to describe a third embodiment.

FIG. 7 illustrates the cross section of a MISFET, a semiconductor device described in the embodiment 3. This is an embodiment, wherein a dielectric comprising a composite film of polycrystalline niobium pentoxide and amorphous tantalum pentoxide is applied to the gate insulator of a MISFET.

First, a silicon oxide film 11 is formed on the surface of a semiconductor substrate 9, channels 10 of the device separation area and inside the channels 10. Next is a process, wherein a composite film of niobium pentoxide and tantalum pentoxide is deposited. The deposition of the composite film is carried out under the same conditions as described in embodiment 1. Additionally, the film is heat-treated under the same condition as described in embodiment 1, forming a dielectric, wherein amorphous tantalum pentoxide is present along the grain boundaries of the polycrystalline niobium pentoxide. This dielectric will become a MISFET gate insulator as explained in the following.

Next, a polycrystalline silicon film is deposited on the dielectric and the polycrystalline silicon film and dielectric are removed by etching using a photoresist film as a mask. This process provides gate electrode 13 of a polycrystalline silicon film and gate insulator 12 of the composite layer of polycrystalline niobium pentoxide and amorphous tantalum pentoxide.

In the next process, impurity ions are injected with a low concentration to form a semiconductor region 14 using a photoresist film and gate electrode 13 as a mask. Moreover, a silicon nitride film or silicon oxide film are formed to cover the entire surface, and by anisotropic etching, side-wall spacer 15 is formed along the wall of gate electrode 13. Furthermore, semiconductor region 16 is formed by high concentration ion injection using the photoresist film, gate electrode 13, and side wall spacer 15 as a mask. Semiconductor regions 14 and 16 constitute a source-drain region in a so-called LDD structure.

The foregoing method is a method of manufacturing a MISFET. After this, an insulating interlayer is formed, and then 1-layer wiring connecting with the semiconductor region 16 is formed. A wiring of a further upper layer is formed through the insulating interlayer.

The embodiment 3 provides a way to avoid oxidation of the silicon substrate 9 because it makes it possible to decrease the crystallization temperature of the capacitor dielectric. As a result, because the capacity of the gate insulator can be increased, increasing the film thickness of the gate insulator and decreasing the leakage current become possible. Keeping the characteristics of a transistor when a highly integrated semiconductor device is realized using a conventional silicon oxide film, it would be necessary to thin the film thickness to maintain the capacitance, resulting in increasing the tunnel current.

However, using a gate insulator comprising a composite film of polycrystalline niobium pentoxide and amorphous tantalum pentoxide, the film thickness may be increased to keep the same capacitance, resulting in a MISFET which causes less tunnel current.

Polycrystalline silicon is used for the gate electrode 13 in the embodiment described above, but the material is not limited to the example. A metal electrode such as titanium nitride, tungsten, and tungsten nitride, for example, may be used.

Moreover, a silicon nitride film may be deposited on the surface of the semiconductor substrate 9 before forming the gate insulator 12. For instance, a silicon nitride film can be formed on the surface by a heat-treatment in an ammonia atmosphere. This silicon nitride is effective to prevent the polycrystalline silicon, which becomes a channel region, from oxidation during the formation process and heat-treatment process of the dielectric. The part of gate insulator 12 placed between the semiconductor substrate 9 and the gate electrode 13 is a capacitor of a so-called MIS structure. Applying a variety of capacitors to the part, the effect of each capacitor can be checked.

Moreover, the MISFET described in embodiment 3 can be applied to semiconductor devices such as SRAM, electrically rewritable batch elimination type read only memory, MISFET for selecting a DRAM memory cell, and MISFET for peripheral circuits, for example.

According to a typical embodiment of the present invention, the heat-treatment temperature of a capacitor dielectric can be lowered to control decrease of capacitance caused by oxidation of a polycrystalline silicon bottom electrode (MIS structure) and increase of contact resistance caused by oxidation of a barrier metal (MIM structure). The invention provides a way to improve circuit integration by miniaturizing a semiconductor capacitor device, to improve manufacturing yield by simplifying a method of manufacture, and to increase reliability of manufactured devices.

This invention provides a greater dielectric constant compared with a tantalum pentoxide film, and makes it possible to increase the amount of signal and to improve the reliability of the device operation.

The invention has been described with reference to preferred embodiments. However, it is to be understood that the invention is not intended to be limited to the above-mentioned specific embodiments and variations may be made by one skilled in the art without departing from the scope of the invention.

What is claimed is:

1. A semiconductor device comprising:
   a first conducting film formed over a semiconductor substrate;
   a dielectric deposited on said first conducting film; and
   a second conducting film formed on said dielectric,
   wherein said dielectric comprises a polycrystalline metal oxide with a first crystallization temperature, having a plurality of crystal grains, and an amorphous metal oxide with a second crystallization temperature higher than the first crystallization temperature, present at boundaries formed between said crystal grains,
   wherein a metal material of said polycrystalline metal oxide is different from a metal material of said amorphous metal oxide, and
   wherein said polycrystalline metal oxide comprises niobium pentoxide.

2. A semiconductor device comprising:
   a first conducting film formed over a semiconductor substrate;
   a dielectric deposited on said first conducting film; and
   a second conducting film formed on said dielectric,
   wherein said dielectric comprises a polycrystalline metal oxide with a first dielectric constant and first crystallization temperature, having a plurality of crystal grains, and an amorphous metal oxide, having a lower dielectric constant than said first dielectric constant and a higher crystallization temperature than said first crystallization temperature, present at boundaries formed between said crystal grains,
   wherein a metal material of said polycrystalline metal oxide is different from a metal material of said amorphous metal oxide, and
   wherein said polycrystalline metal oxide comprises niobium pentoxide.

3. A semiconductor device having a capacitor comprising:
   a first electrode of said capacitor comprising a first conducting film formed over a semiconductor substrate;
   a dielectric deposited on said first electrode; and
   a second electrode of said capacitor comprising a second conducting film formed on said dielectric,
   wherein the dielectric comprises a polycrystalline metal oxide with a first crystallization temperature, having a plurality of crystal grains, and an amorphous metal oxide with a second crystallization temperature higher than the first crystallization temperature, present at boundaries formed between said crystal grains,
   wherein a metal material of said polycrystalline metal oxide is different from a metal material of said amorphous metal oxide, and
   wherein said polycrystalline metal oxide comprises niobium pentoxide.

4. A semiconductor device according to claim 3, wherein said first electrode comprises a material selected from ruthenium, platinum, copper, titanium nitride, tantalum nitride and tungsten nitride.

5. A semiconductor device according to claim 3, wherein said first electrode comprises polycrystalline silicon.

6. A semiconductor device according to claim 1, wherein the amorphous metal oxide comprises tantalum pentoxide.

7. A semiconductor device according to claim 6, wherein the proportion of the amorphous metal oxide in said dielectric is from 5% to 50%.

8. A semiconductor device according to claim 1, wherein the amorphous metal oxide comprises at least one oxide selected from among tantalum, silicon, titanium, and tungsten.

9. A semiconductor device according to claim 1, wherein the film thickness of said dielectric is from 5 nm to 20 nm.

10. A semiconductor device according to claim 2, wherein the amorphous metal oxide comprises tantalum pentoxide.

11. A semiconductor device according to claim 10, wherein the proportion of the amorphous metal oxide in said dielectric is from 5% to 50%.

12. A semiconductor device according to claim 2, wherein the amorphous metal oxide comprises at least one oxide selected from among tantalum, silicon, titanium, and tungsten.

13. A semiconductor device according to claim 2, wherein the film thickness of said dielectric is from 5 nm to 20 nm.

14. A semiconductor device according to claim 3, wherein the amorphous metal oxide comprises tantalum pentoxide.

15. A semiconductor device according to claim 14, wherein the proportion of the amorphous metal oxide in said dielectric is from 5% to 50%.

16. A semiconductor device according to claim 3, wherein the amorphous metal oxide comprises at least one oxide selected from among tantalum, silicon, titanium, and tungsten.

17. A semiconductor device according to claim 3, wherein the film thickness of said dielectric is from 5 nm to 20 nm.

* * * * *